(12) United States Patent
Evans

(10) Patent No.: US 6,686,535 B1
(45) Date of Patent: Feb. 3, 2004

(54) SHIELDING ENCLOSURE FOR ELECTRONIC COMPONENTS

(75) Inventor: James Patrick Evans, Milton Keynes (GB)

(73) Assignee: Mektron Systems Limited, Bedford (GB)

( * ) Notice: Subject to any disclaimer, the term of this patent is extended or adjusted under 35 U.S.C. 154(b) by 0 days.

(21) Appl. No.: 09/529,585

(22) PCT Filed: Oct. 14, 1998

(86) PCT No.: PCT/GB98/03065
§ 371 (c)(1),
(2), (4) Date: Apr. 14, 2000

(87) PCT Pub. No.: WO99/20092
PCT Pub. Date: Apr. 22, 1999

(30) Foreign Application Priority Data

Oct. 14, 1997 (GB) .............................................. 9721660

(51) Int. Cl.[7] .................................................. H05K 9/00
(52) U.S. Cl. ............................... 174/35 GC; 174/35 R; 361/816
(58) Field of Search .......................... 174/35 R, 35 GC; 361/816, 818, 800, 752

(56) References Cited

U.S. PATENT DOCUMENTS 3,247,312 A * 4/1966 Alessi ....................... 174/35 R
5,285,007 A * 2/1994 Deluca et al. ............ 174/35 R
6,173,970 B1 * 1/2001 Choudary et al. .......... 277/644

FOREIGN PATENT DOCUMENTS

GB       2208970    * 4/1989 ............ H05K/9/00

* cited by examiner

*Primary Examiner*—Hung V. Ngo
(74) *Attorney, Agent, or Firm*—Perman & Green, LLP

(57) ABSTRACT

A shielding enclosure for electronic components, comprises a hollow body, having a sheet metal wall portion and an opening closed by a readily-removable sheet metal panel, with interdigitation between an edge zone of the wall portion and an adjacent, edge zone of the panel, the interdigitation constituting a U-section channel on the wall portion and an interdigitating flange on the panel.

10 Claims, 3 Drawing Sheets

SHIELDING ENCLOSURE FOR ELECTRONIC COMPONENTS

BACKGROUND OF THE INVENTION

This invention relates to a panel for an enclosure that shields electronic components from electromagnetic interference and/or prevents the emission of electromagnetic radiation.

It is known to provide such an enclosure with one door in the form of a removable side panel that is held in place by a large number of screws and has between itself and the body of the enclosure a gasket to create a seal. The system has a number of disadvantages, such as that entering the enclosure, to maintain the electronic components for example, is a tedious process; and, over time, the gasket deteriorates and so the quality of the seal and thereby the effectiveness of the enclosure reduce.

EP-A-0781080 discloses an hermetically sealed and electromagnetically shielded casing to house electronic components. The casing comprises a casing body, which is trough-shaped and has a circumferential, preferably overhanging, edge, and a casing lid which fits against the circumferential edge of the casing body, encloses it, and with its edge presses against the outer wall of the casing body. The casing lid can also fit against the inner wall of the casing body and press against the inner wall. The casing lid has a ring-pull to open the casing. At a distance from the inner wall of the casing body, the casing lid has an external stamped strip to take an auxiliary tool, preferably a tin opener. The use of metal material for both casing components electromagnetically shields the casing. Tinplate, aluminium or a similar thin-walled material is used to give both minimum dimensions and light weight. The stamped strip takes the auxiliary tool, to allow the casing lid to be slit at given points and partially pulled away from the casing using the ring-pull. The casing can be opened in this way. The casing may be sheathed in plastic.

FR-A-894705 discloses a screening box which is electrically sealed at a joint. The electrically sealed joint is obtained by folding two sheet metal pieces at their edges to form U-channels engaged one in the other in such manner that the exterior surface of one of the edges presses resiliently against the interior surface of the other edge.

U.S. Pat. No. 5,278,351 discloses a personal computer cabinet with a cabinet base, an integral rear panel, a front panel, and two upwardly extending lips from the base. A cabinet cover engages with the front panel, the rear panel and includes two spring channel clips which engage with the lips of the base to negate or minimize any electromagnetic interference radiations from the electrical components inside a computer housing. A flexible sealing gasket may be provided between each base lip and the adjacent side of the cabinet cover and is held in place by spring pressure from the adjacent spring channel clip to effect an hermetic seal.

SUMMARY OF THE INVENTION

According to the present invention, there is provided a shielding enclosure for electronic components, comprising a hollow body, said hollow body having a sheet metal wall portion and an opening closed by a readily-removable sheet metal panel, with interdigitation between an edge zone of said wall portion and an adjacent edge zone of said panel, said interdigitation constituting a U-section channel on one of said wall portion and said panel and an interdigitating edge on the other of said wall portion and said panel, said U-section channel being integral with said one of said wall portion and said panel, and the arrangement being such that, when said panel is opened, relative movement between said interdigitating edge and said U-section channel is thereby produced.

Owing to the interdigitation, since electromagnetic radiation travels in straight lines, it cannot pass between those edge zones. Moreover, the panel is readily openable and readily re-closable.

In a preferred embodiment, the enclosure is generally of the shape of a rectangular parallelepiped and comprises a frame carrying panels on all six sides, with such interdigitation provided along all edges of the shape. On the other hand, if there are edges at which such panels are integral with each other, such interdigitation is not provided at those edges. At least one of the panels is readily openable, for example is locked or latched to the enclosure body and/or is attached thereto by a few screws, with any other panels being permanently fixed to the frame. The or each openable panel may be in the form of a door hingedly mounted at one edge region and having over at least part of its periphery a flange which mates with a U-section channel provided by the adjacent edge zones of the adjacent wall portions.

DESCRIPTION OF THE DRAWING

In order that the invention may be clearly understood and readily carried into effect, reference will now be made, by way of example, to the accompanying drawings, in which.

DETAILED DESCRIPTION OF THE PREFERRED EMBODIMENT

Figure 1:
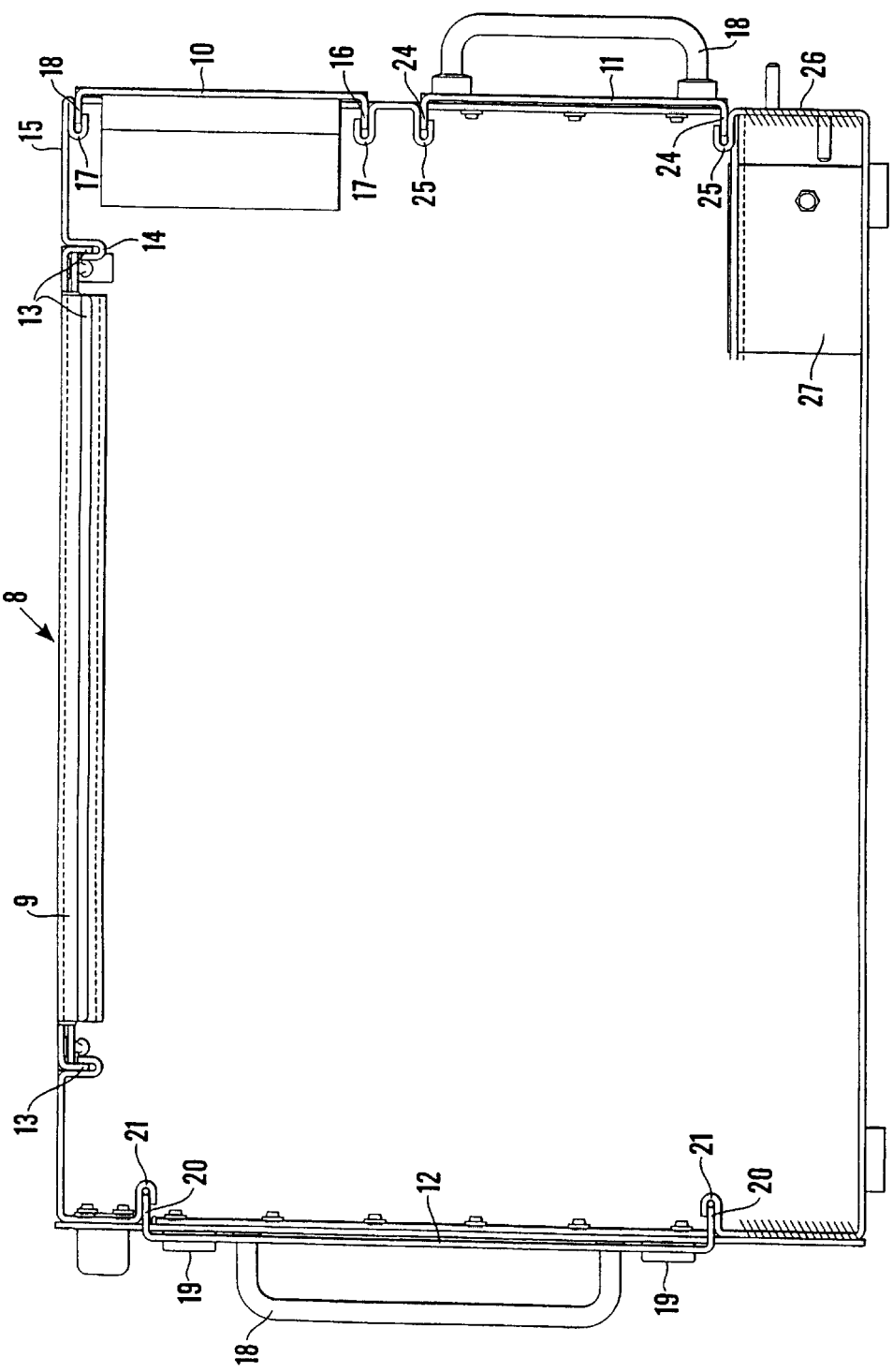
FIG. 1 is a vertical sectional view through an enclosure with panels and a door in place.

FIG. 1 shows an enclosure 8 which is provided with four removable panels 9, 10, 11 and 12, one of which, 12 is formed as a hinged door. The panel 9, on the top of the enclosure 8 is flanged at 13 around substantially the whole of its perimeter, and the flanging 13 interdigitates with a U-section channel 14 which is part of the top wall 15 of the enclosure. Similarly, the panels 10 and 11 are respectively flanged at 16 and 24 at their perimeters to interdigitate with respective U-section channels 17 and 25 of the enclosure body. The panels 9, 10 and 11 are attached by screws to the enclosure body so as to be readily removable for access to the interior of the enclosure 8.

The door 12 has hinges 19 to allow the door to be opened for access to the interior of the enclosure 8. The door 12 has a flange 20 that runs along the three non-hinged edges of the door and interdigitates with a U-section channel 21 which is formed in the enclosure body and correspondingly runs around the three edges of the door.

The enclosure 8 is provided with handles 18 for ease of carrying, when the enclosure 8 is required to be moved.

The enclosure 8 is designed to receive electronic equipment and/or components that are required to be shielded from electromagnetic radiation. A user can obtain access to the enclosure from any of the panels as desired, for example, for the installation of equipment and/or the replacement or maintenance of equipment within the enclosure.

The enclosure 8 includes an internal power supply 27 for providing power to those components or equipment that require power. The supply 27 has an external lead (not shown) that can be connected to the mains supply.

Figure 2:
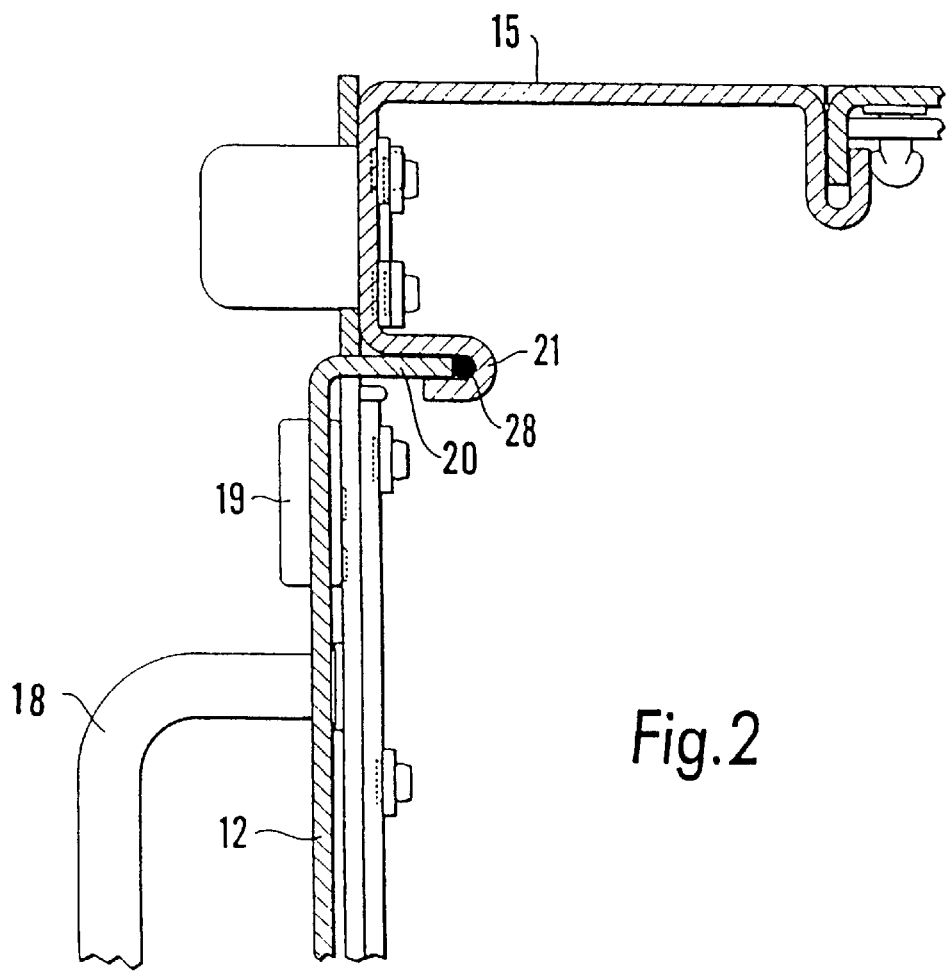
FIGS. 2 and 3 are details of FIG. 1.

FIG. 2 shows a detail of the top left-hand corner of FIG. 1, with the inclusion of a gasket 28 in the base of the U-section channel 21. The gasket 28 runs along the entire length of the channel 21.

Figure 3:
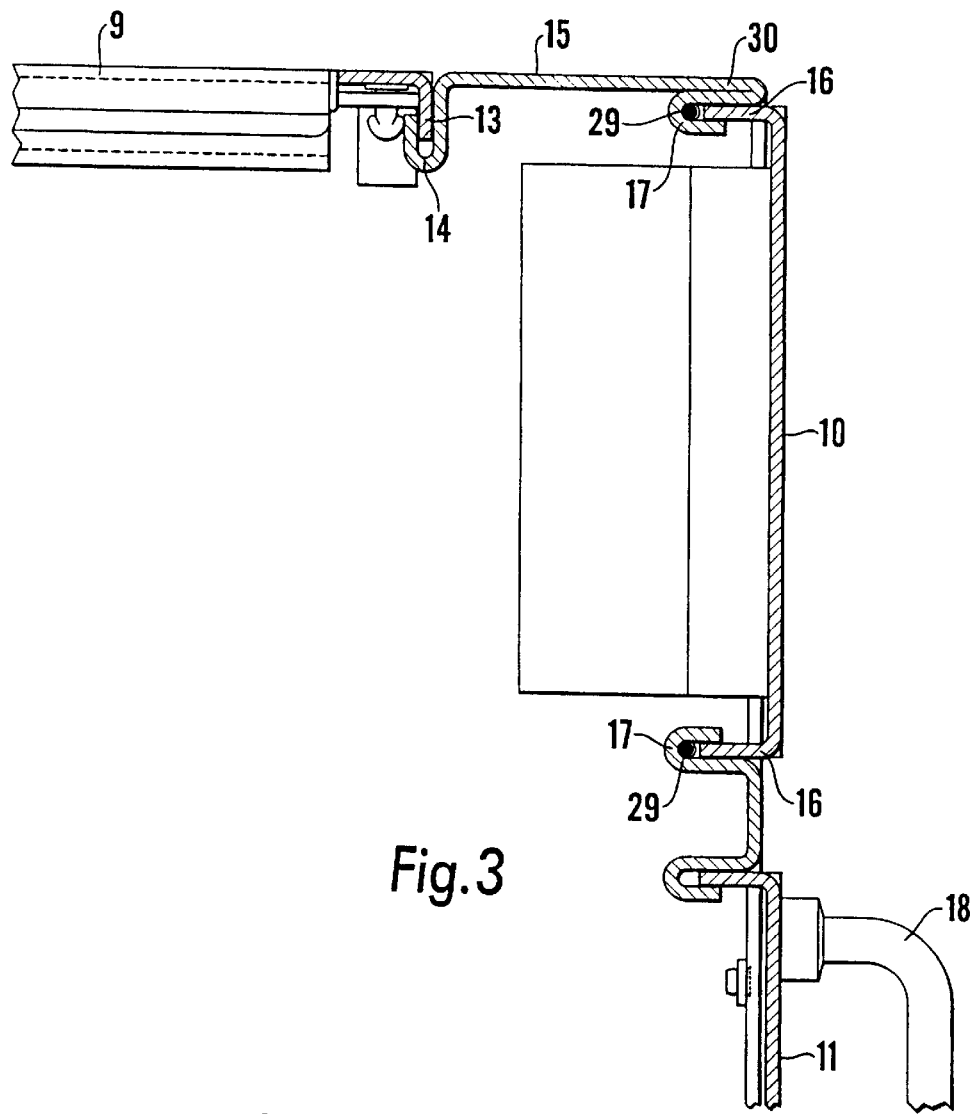

FIG. 3 shows a detail of the top right-hand corner of FIG. 1, again with the inclusion of a gasket 29 in the U-section channel 17. The top wall of the enclosure is provided with a crush fold 30 which forms a rim 31 for increased strength, as shown in FIG. 3.

Figure 4:
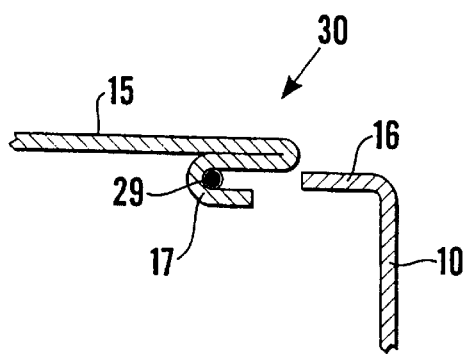
FIG. 4 is a diagrammatic detail of FIG. 3, but showing a panel partially open.

FIG. 4 shows the panel 10 partially open, with the flange 16 moving clear of the U-section channel 17. The gasket 29 remains in the channel 17 at all times.

The panels and the body of the enclosure 8 are of sheet metal, for example aluminium, constituting a barrier to. electromagnetic radiation. The flanges, U-section channels and crush-folds are formed by folding the sheet metal during manufacture.

The interdigitation between the flanges and the respective channels provide a simple and effective way of achieving an electromagnetic radiation/interference seal between metallic/conductive surfaces. This is primarily due to the high attenuation characteristics brought about by creating a circuitous route for electromagnetic radiation.

The need for secondary EMI (electromagnetic interference) gasketting (such as the gaskets 28 and 29) for many applications is removed. The number of fixings such as screws/clips etc. can be significantly reduced. Structural strength in formed sheet metal is greatly increased by the meandering cross-section provided by the channels and the crush fold. The interdigitation can be easily upgraded to offer a higher level of EMI sealing by the inclusion of the annular gasket in the bottom of any channel. Inclusion of such gasket in the bottom of the channel has the added benefit of providing an hermetic seal, thereby reducing water/moisture ingress. The gasket material when so fitted can be retained in any channel by friction only, so avoiding any need for the gasket to be glued in position. Moreover, with the gasket in the channel, the gasket is protected from handling damage. Furthermore, it is simple to install, remove and replace—it is just pushed into the channel.

I claim:

1. A shielding enclosure for electronic components, comprising a hollow body, said hollow body having a sheet metal wall portion and an opening closed by a readily-removable sheet metal panel, with interdigitation between an edge zone of said wall portion and an adjacent edge zone of said panel, said interdigitation constituting a U-section channel on one of said wall portion and said panel and an interdigitating-edge on the other of said wall portion and said panel, said U-section channel being integral with said one of said wall portion and said panel, said one of said portion and said panel including a rim at an outer side of said channel and in the form of a crush fold and the arrangement being such that, when said panel is opened, relative movement between said interdigitating edge and said U-section channel is thereby produced.

2. An enclosure according to claim 1, wherein said interdigitating edge is in the form of a flange.

3. An enclosure according to claim 1, wherein said U-section channel contains a gasket at its base and said gasket is frictionally retained in position in said channel.

4. An enclosure to claim 3, wherein said panel is in the form of a hinged door.

5. A shielding enclosure for electronic components, comprising a hollow body, said hollow body having a sheet metal wall portion and an opening closed by a readily-removable sheet metal panel, with interdigitation between an edge zone of said wall portion and an adjacent edge zone of said panel, said interdigitation constituting a U-section channel on one of said wall portion and said panel and an interdigitating edge on the other of said wall portion and said panel, said U-section channel being integral with said one of said wall portion and said panel, said interdigitating edge being in the form of a flange and the arrangement being such that, when said panel is opened, relative movement between said interdigitating edge and said U-section channel is thereby produced.

6. An enclosure according to claim 5, wherein said U-section channel contains a gasket at its base and said gasket is frictionally retained in position in said channel.

7. An enclosure according to claim 5, wherein said panel is in the form of a hinged door.

8. A shielding enclosure for electronic components, comprising a hollow body, said hollow body having a sheet metal wall portion and an opening closed by a readily-removable sheet metal panel, with interdigitation between an edge zone of said wall portion and an adjacent edge zone of said panel, said interdigitation constituting a U-section channel on one of said wall portion and said panel and an interdigitating edge on the other of said wall portion and said panel, said U-section channel being integral with said one of said wall portion and said panel, said U-section channel containing a gasket at its base, said gasket being frictionally retained in position in said channel, and the arrangement being such that, when said panel is opened, relative movement between said interdigitating edge and said U-section channel is thereby produced.

9. An enclosure according to claim 8, wherein said panel is in the form of a hinged door.

10. A shielding enclosure for electronic components, comprising a hollow body, said hollow body having a sheet metal wall portion and an opening closed by a readily-removable sheet metal panel in the form of a hinged door, with interdigitation between an edge zone of said wall portion and an adjacent edge zone of said panel, said interdigitation constituting a U-section channel on one of said wall portion and said panel and an interdigitating edge on the other of said wall portion and said panel, said U-section channel being integral with said one of said wall portion and said panel, and the arrangement being such that, when said panel is opened, relative movement between said interdigitating edge and said U-section channel is thereby produced.

* * * * *